(12) United States Patent
Takahashi

(10) Patent No.: US 6,528,757 B2
(45) Date of Patent: Mar. 4, 2003

(54) APPARATUS PROCESSING A GATE PORTION IN A SEMICONDUCTOR MANUFACTURING APPARATUS, WHICH REMOVE A GATE CORRESPONDENCE PORTION FROM A SEMICONDUCTOR PACKAGE CONNECTED TO A LEAD FRAME, AND A RESIN BURR DEPOSITED ON A LEAD PORTION ASSOCIATED WITH THE SEMICONDUCTOR PACKAGE

(75) Inventor: Takehiko Takahashi, Yamagata (JP)

(73) Assignee: NEC Corporation, Tokyo (JP)

( * ) Notice: Subject to any disclaimer, the term of this patent is extended or adjusted under 35 U.S.C. 154(b) by 42 days.

(21) Appl. No.: 09/870,218

(22) Filed: May 30, 2001

(65) Prior Publication Data

US 2001/0049161 A1 Dec. 6, 2001

(30) Foreign Application Priority Data

Jun. 2, 2000 (JP) ........................................ 2000-166189

(51) Int. Cl.[7] .............................................. B23K 26/38
(52) U.S. Cl. ................................ 219/121.67; 219/121.7
(58) Field of Search ...................... 438/940; 219/121.67, 219/121.68, 121.69, 121.7, 121.71, 121.72, 121.78, 121.8

(56) References Cited

U.S. PATENT DOCUMENTS

| 4,744,838 A | * | 5/1988 | Lin et al. ..................... 148/120 |
| 4,859,806 A | * | 8/1989 | Smith .......................... 174/261 |
| 5,893,954 A | * | 4/1999 | Nanataki et al. .......... 156/89.11 |
| 6,006,981 A | * | 12/1999 | Madrid ..................... 228/180.5 |
| 6,355,505 B1 | * | 3/2002 | Maeda et al. ............... 438/122 |
| 6,388,231 B1 | * | 5/2002 | Andrews ................ 219/121.69 |

FOREIGN PATENT DOCUMENTS

| JP | 07-201898 | 8/1995 |
| JP | 2000-021220 | 1/2000 |

* cited by examiner

*Primary Examiner*—Tom Dunn
*Assistant Examiner*—Jonathan Johnson
(74) *Attorney, Agent, or Firm*—Katten Muchin Zavis Rosenman

(57) ABSTRACT

An apparatus processing a gate portion in a semiconductor manufacturing apparatus includes a laser beam scanner unit and a cutter. The laser beam scanner unit is disposed along a carrying line on which a lead frame is carried. The laser beam scanner unit has an optical scanner unit second-dimensionally scanning laser beams, and a lens unit collecting the laser beams. The cutter has a punch. The punch mechanically pushes to cut a gate correspondence portion which is perfectly cut away or almost cut away from a semiconductor package body by the laser beams.

18 Claims, 6 Drawing Sheets

APPARATUS PROCESSING A GATE PORTION IN A SEMICONDUCTOR MANUFACTURING APPARATUS, WHICH REMOVE A GATE CORRESPONDENCE PORTION FROM A SEMICONDUCTOR PACKAGE CONNECTED TO A LEAD FRAME, AND A RESIN BURR DEPOSITED ON A LEAD PORTION ASSOCIATED WITH THE SEMICONDUCTOR PACKAGE

BACKGROUND OF THE INVENTION

1. Field of the Invention

The present invention relates to an apparatus for and a method of processing a gate portion in a semiconductor manufacturing apparatus. More particularly, the present invention relates to an apparatus for and a method of processing a gate portion in a semiconductor manufacturing apparatus, which remove a gate correspondence portion from a semiconductor package connected to a lead frame, and a resin burr deposited on a lead portion associated with the semiconductor package.

2. Description of the Related Art

A semiconductor manufacturing apparatus includes the steps of: sealing many semiconductor parts in a lead frame, which is continuously extending in a direction in a form of band, with resin by an injection molding operation, and assembling as a semiconductor package, and then cutting and removing a gate portion resulting from the molding operation, and a resin burr deposited on a runner portion and a lead portion. FIG. 1 shows the schematic shape of a lead frame 101 and the arrangement of many semiconductor packages 102 assembled on the surface of the lead frame. FIGS. 2A and 2B show the gate portion deposited on one semiconductor package 102 and the resin burrs deposited on a runner portion and a lead portion, mainly with regard to an upper half. The semiconductor package 102 has a lead portion 104 extending to an outer side from an inner side, as a part of a lead frame that short-circuits a peripheral portion of a hole 103 formed in the lead frame 101. When the semiconductor package 102 is formed, a gate correspondence portion 105 formed in a runner and a gate of a molding member of a transfer mold (an injection molding machine), and a runner correspondence portion 106 formed in the runner connected to the gate are left after the molding operation. The gate correspondence portion 105 is deposited on one side of a central portion located at a center in a thickness direction of the semiconductor package 102. A resin burr 109 is left after the molding operation at a thickness equal to that of the lead portion 104 on the surface around the lead portion 104.

FIG. 3 shows a cutting mold 107 for cutting and removing the gate correspondence portion 105 and the runner correspondence portion 106. As shown in FIG. 4, one of the semiconductor packages flowing in series in the sheet of the lead frame 101 is cut away at a particular point by a punch 108 and a die 110 of the cutting mold 107. It is cut away by the action that the punch 108 pushes the gate correspondence portion 105 and the runner correspondence portion 106 under an integral condition in one direction. The resin burr 109 is removed by making a pressure of a solution, in which abrasive material and water are mixed, higher at a next process, and spraying it onto the entire semiconductor package, and then dropping.

The semiconductor package has been made further thinner and smaller. High filling resin is used as resin. Only by using the high filling resin, it is difficult to protect the occurrence of a sealing defect (non-filling and generation of void). It is necessary to provide a thickness equal to or greater than a certain value as a thickness of the gate. As the package is made thinner and smaller so that a rate of the gate thickness is greater with respect to the package thickness, the pushing and cutting operation of a known cutting method has the fear of an occurrence of a broken piece 111 at a side position of the lead portion 104 of the package, as shown in FIG. 5. So, this may bring about a reduction in a yield. On the other hand, the known method of removing the resin burr 109 has the problem that the abrasive material is clogged between the leads in which an interval is made narrower as the semiconductor package is made further thinner and smaller. Also, it has the problem that the mold is damaged since the resin burr is drawn into the cutting mold, at a next step at which a part of the lead portion is cut away by the mold, and the package is sliced.

A technique for solving such problems is known from Japanese Laid Open Patent Application (JP-A-Heisei, 7-201898). This technique radiates a laser to a gate correspondence portion, cuts and separates the gate correspondence portion away from a main body of a package, or forms a notch in the gate correspondence portion, and accordingly makes the pushing and cutting operation using the mold proper. The employment of such laser technique proposes an approach to solve the above-mentioned problems. However, the cut result and the notch formation may be improper depending on the kinds of lasers having various wave lengths and strengths. Also, the cut result and the notch formation may be improper depending on the laser radiation manner. Thus, it is desirable to establish the actually using manner of the laser.

Japanese Laid Open Patent Application (JP-A-2000-21220) discloses the following method of manufacturing a light guide plate. The method of manufacturing a light guide plate is the method of injecting melt synthetic resin from a gate placed in a casting mold into a cavity, and molding a light guide plate portion and a gate portion protruding from the light guide plate portion, and then removing the gate portion from the light guide plate portion, and accordingly manufacturing the light guide plate, wherein the removal of the guide plate portion is done by using an energy beam.

SUMMARY OF THE INVENTION

The present invention is accomplished in view of the above mentioned problems. Therefore, an object of the present invention is to provide an apparatus for and a method of processing a gate portion in a semiconductor manufacturing apparatus, which can establish an actual application technique of a laser in order to properly cut a gate.

In order to achieve an aspect of the present invention, an apparatus processing a gate portion in a semiconductor manufacturing apparatus, includes: a laser beam scanner unit disposed along a carrying line on which a lead frame is carried; and a cutter, and wherein the laser beam scanner unit has an optical scanner unit second-dimensionally scanning laser beams, and a lens unit collecting the laser beams, and wherein the cutter has a punch, the punch mechanically pushing and cutting a gate correspondence portion which is perfectly cut away or almost cut away from a semiconductor package body by the laser beams.

In this case, the laser beams are YAG laser beams.

Also in this case the optical scanner unit includes: a first scanner unit scanning a light collection point of the laser beams in an X-axis direction; and a second scanner unit scanning the light collection point of the laser beams in a Y-axis direction substantially orthogonal to the X-axis direction, and wherein the laser beam scanned in the Y-axis direction cuts away the gate correspondence portion, and wherein the laser beam scanned in the Y-axis direction removes resin burrs deposited on lead portions exposed from the semiconductor package body.

Further in this case, scan lines of the laser beams scanned in the X-axis direction includes two scan lines oriented in the X-axis direction and a micro scan line which connects the two scan lines to be oriented in the Y-axis direction.

In this case, the apparatus processing a gate portion in a semiconductor manufacturing apparatus further includes: a picture inspector calculating a distance between a boundary line between the gate correspondence portion and the semiconductor package body, which is equivalent to a cut line by the cutting operation of the cutter, and an end plane of the semiconductor package located on a side opposite to the cut line, based on a picture to be photographed to judge whether or not the distance is within a set range.

Also in, this case, the picture inspector includes a CCD camera having a pixel address on a photographic plane.

A method of processing a gate portion in a semiconductor manufacturing apparatus, includes: scanning a radiation point of a laser beam in a X-axis direction; scanning a radiation point of the laser beam in a Y-axis direction; cutting away a gate correspondence portion of a semiconductor package body connected to a lead frame by using the laser beam scanned in the Y-axis direction; removing a resin burr deposited on a lead portion connected to the lead frame by using the laser beam scanned in the X-axis direction; and pushing and cutting away the gate correspondence portion, which is cut by the cutting operation and is connected to the lead frame, by using a mold.

In this case, the laser beam is a YAG laser beam.

DESCRIPTION OF THE PREFERRED EMBODIMENTS

Figure 6:
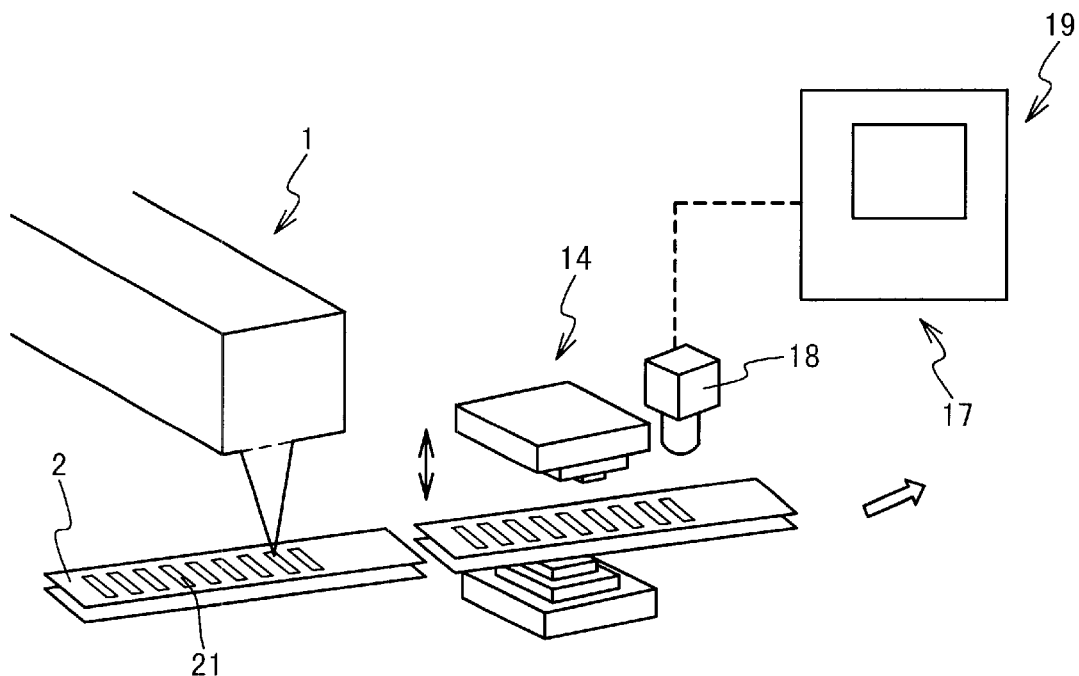
FIG. 6 is a slant axis projection view showing an embodiment of an apparatus for processing a gate portion in a semiconductor manufacturing apparatus according to the present invention.

Correspondingly to the attached drawings, an embodiment of the method of processing a gate portion in a semiconductor manufacturing apparatus according to the present invention has a cutting mold together with a laser beam scanner unit. Its laser scanner unit 1 is disposed on an upper side of a carrying path to generate a continuous flow direction of a lead frame 2, as shown in FIG. 6. The laser scanner unit 1 has a laser oscillator 3, a laser light collection lens unit 4 and an optical scanner unit 5. An experimental result indicates that a YAG laser is the most preferable for the laser.

The laser light collection lens unit 4 is the combination lens composed of a plurality of lens sets (not shown), and it has a function of adjusting a focus. The optical scanner unit 5 is composed of: a first rotation mirror 7 in which a first rotation angle is controlled by a first servo motor 6; and a second rotation mirror 9 in which a second rotation angle is controlled by a second servo motor 8. A reflection plane of the first rotation mirror 7 is parallel to a plane containing a first rotation axis line of a rotation axis of the first servo motor 6, and a reflection plane of the second servo motor 8 is parallel to a plane containing a second rotation axis line of a rotation axis of the second rotation mirror 9.

The first rotation axis line orthogonal to the second rotation axis line. The first rotation mirror 7 scans a laser beam within a first flat plane, and scans the laser beam scanned within the first flat plane, within a second flat plane orthogonal to the first flat plane. Laser beams 11 are controlled in a second-dimensionally positional manner with respect to a radiation target effective region plane 12, and they are collected on the radiation target effective region plane 12. As for its light collection point, any second-dimensionally continuous curve can be drawn on an X-Y flat plane. In order to adjust the final position on the light collection flat plane, it is desirable to add a collimator 13. Such an optical scanner unit is well known. Also, the optical scanner unit having a high accuracy is available on the market. The YAG laser oscillator 3 is also well known, and the YAG laser oscillators 3 having various output powers are available on the market.

A mold cutter 14 for a pushing, cutting and punching is disposed on a rear side from a position where the laser scanner unit 1 is disposed, as shown in FIG. 6. The mold cutter in the conventional technique can be applied in its original state to such a mold cutter. The mold cutter 14 contains a die 15 and a punch 16, as shown in FIG. 8C.

A picture inspector 17 is disposed on a rear side from the mold cutter 14. The picture inspector 17 recognizes a pattern of a picture. In particular, it can judge whether or not a length is proper. The picture inspector 17 is composed of a CCD cameral 18 for capturing a picture and a figure analyzer 19 for analyzing a pattern and a length of a picture.

Figure 8:
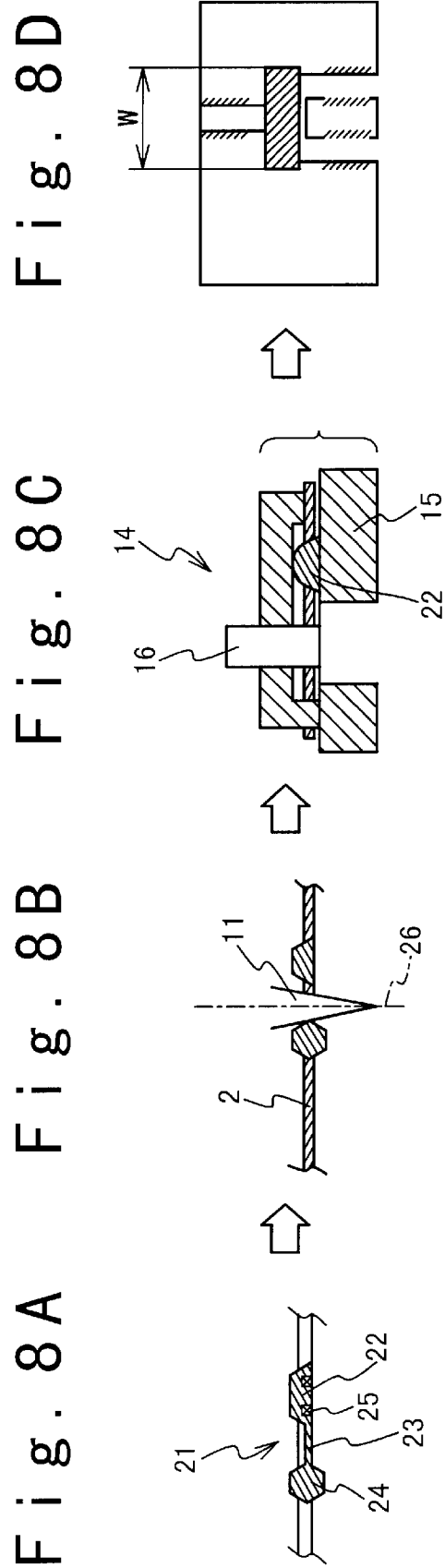
FIG. 8A is a section view showing an action of a step.
FIG. 8B is a section view showing an action of a step.
FIG. 8C is a section view showing an action of a step.
FIG. 8D is a plan view showing an action of a step.

A semiconductor package 21 is carried in one direction on a carrying plane of a carrying path shown in FIG. 8A. The semiconductor package 21 is provided with a package body 22, a gate correspondence portion 23 integrated with the package body 22, and a runner correspondence portion 24 integrally connected to the gate correspondence portion 23. A part of a lead portion 25 is exposed form the package body 22 to external portion.

Figure 7:
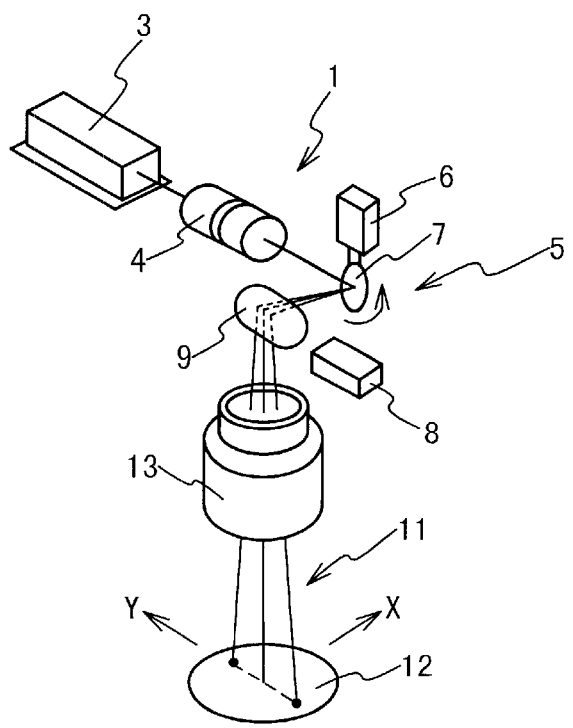
FIG. 7 is a slant axis projection view showing an optical scanner unit.
Figure 9:
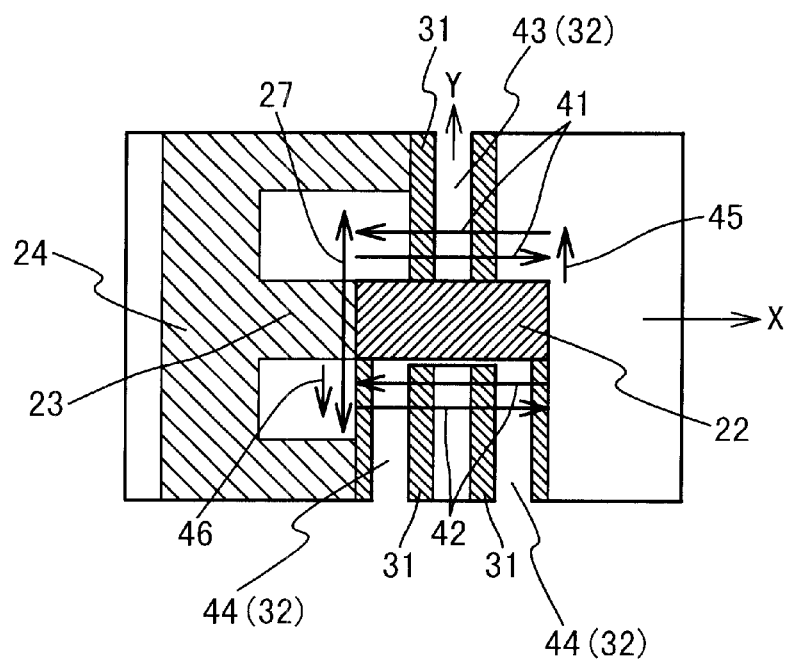
FIG. 9 is a plan view showing a cutting action.

At a laser radiation position, the semiconductor package 21 is stopped under the condition integrated with the lead frame 2. An upper surface of the lead frame 2 is substantially coincident with the radiation target effective region plane 12 shown in FIG. 7. An optical axis line 26 of the laser beams 11 is substantially orthogonal to an upper surface of the gate correspondence portion 23 in a radiation target region. A radiation point implying a tip point of the laser beam 11 is scanned in a Y-axis direction (orthogonal to a carrying direction, refer to FIG. 7) orthogonal to a direction in which the gate correspondence portion 23 is oriented, within a flat plane orthogonal to the optical axis line 26. FIG. 9 shows a Y-axis direction scan line 27 oriented in the Y-axis direction. The scan line 27 is located on a boundary line between the gate correspondence portion 23 and the package body 22, or located near the boundary line.

The gate correspondence portion 23 receiving the laser radiation is perfectly separated from the package body 22, as shown in FIG. 8B. Or, the gate correspondence portion 23 receiving the laser radiation is substantially cut away from the package body 22. The runner correspondence portion 24 is deposited on the lead frame 2, and the gate correspondence portion 23 is deposited through the runner correspondence portion 24 on the lead frame 2.

Figure 1:
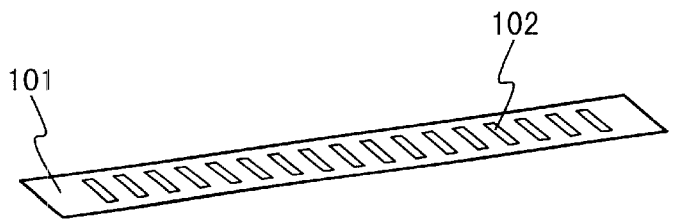
FIG. 1 is a slant axis projection view showing a known lead frame.
Figure 2A:
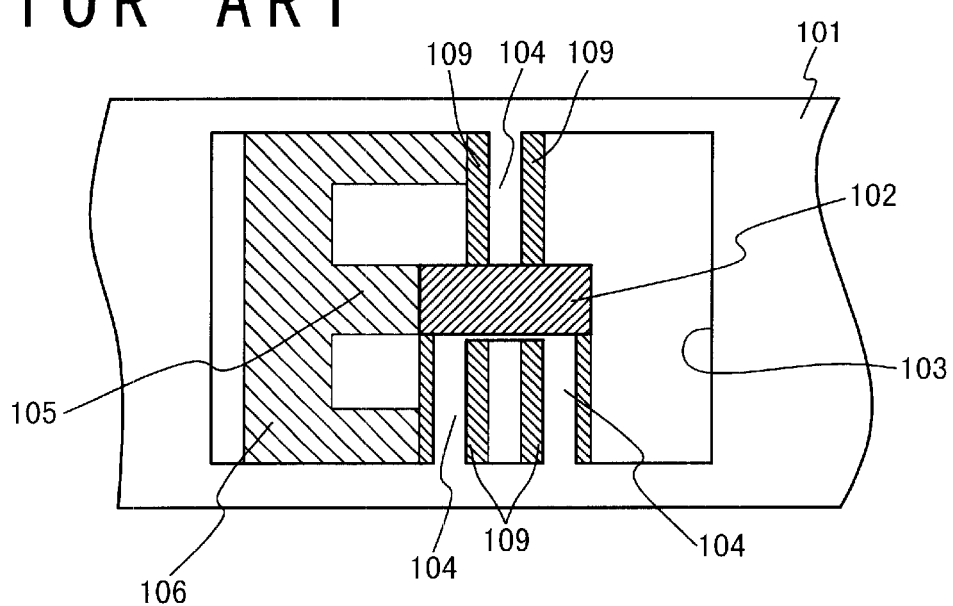
FIG. 2A is a plan view showing a known semiconductor package.
Figure 2B:
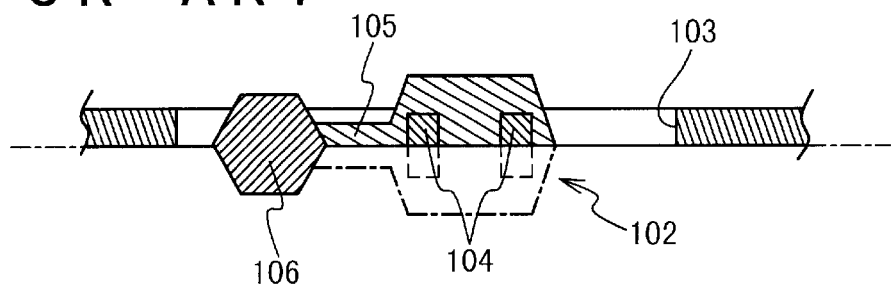
FIG. 2B is a front section view showing a known semiconductor package.
Figure 3:
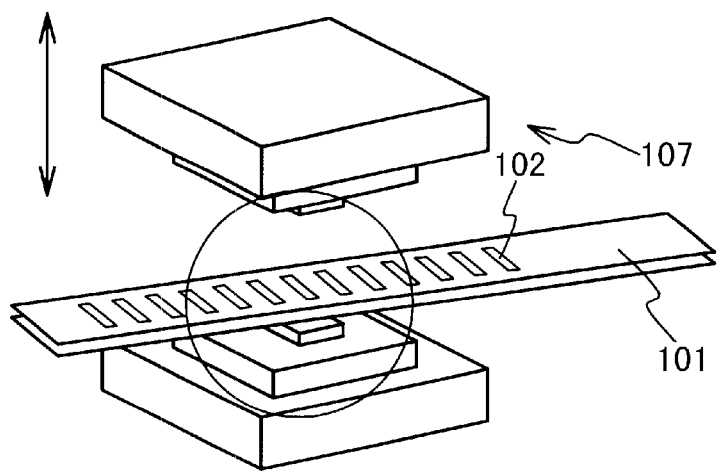
FIG. 3 is a slant axis projection view showing a known cutter.
Figure 4:
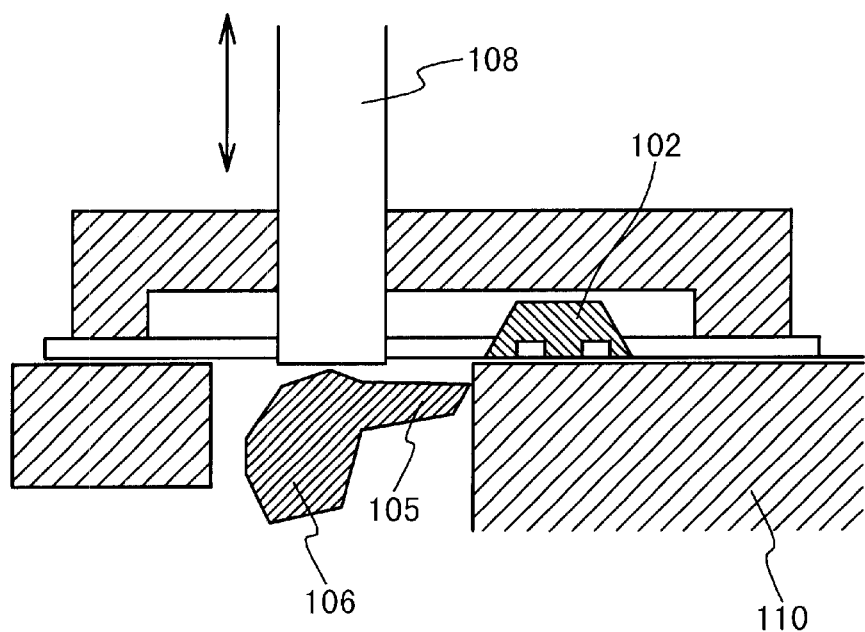
FIG. 4 is a section view showing a known cutting method.
Figure 5:
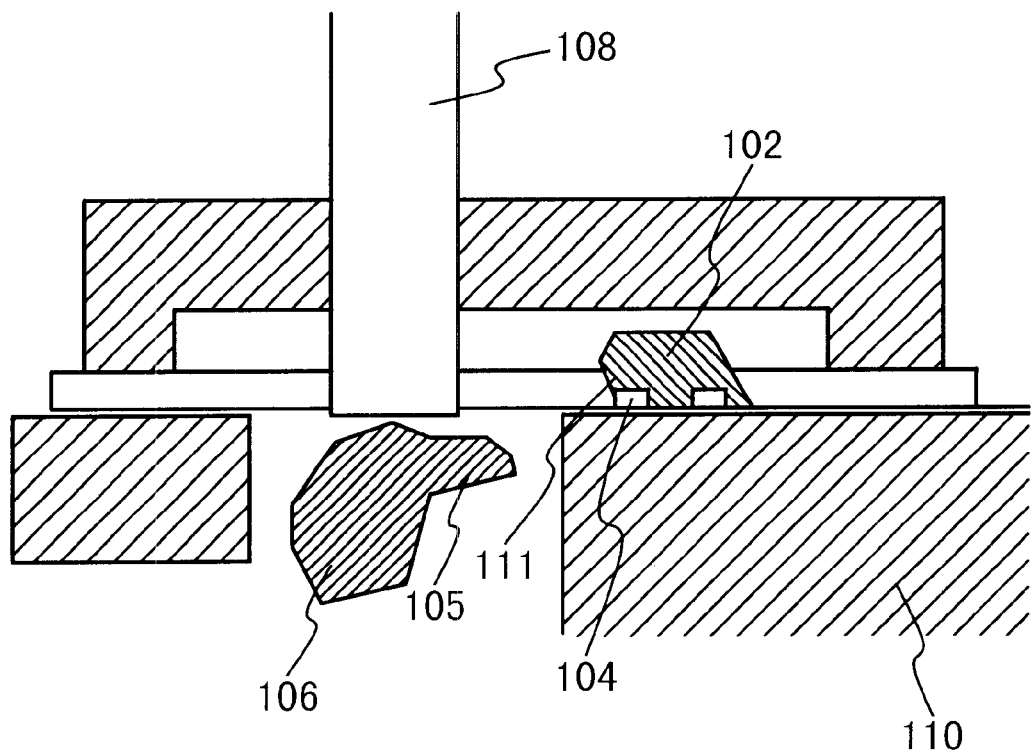
FIG. 5 is a section view showing another known cutting method.

The member into which the non-cut gate correspondence portion 23 and the runner correspondence portion 24 are integrated as mentioned above is pushed, cut and dropped by the punch 16, as shown in FIG. 8C. While this pushing and cutting action is applied to the gate correspondence portion 23, the pushing and cutting force has no influence on the package body 22, or it does not have substantial influence thereon. Thus, the pushing and cutting force is not sent through the gate correspondence portion 23 to the package body 22. And, it is not sent through a resin burr 31 (corresponding to the resin burr 109 of FIG. 2A, refer to FIG. 9) to a lead portion 32 (corresponding to the lead portion 104 of FIG. 2A).

When the reciprocation scan is ended on the Y-axis direction scan line 27, the scan of the laser beams 11 shifts to the scan on the X-axis direction scan line. The X-axis direction scan line is constituted by first reciprocation plural X-axis direction scan lines 41 and second reciprocation plural X-axis direction scan lines 42. The first reciprocation plural X-axis direction scan lines 41 are located in a region close to a plane of the package body 22 in which one side lead portion 43 (corresponding to one side lead portion 104 of FIG. 2A) is located, and the second reciprocation plural X-axis direction scan lines 42 are located in a region close to a plane of the package body 22 in which the other side lead portion 44 (corresponding to the other side lead portion 104 of FIG. 2A) is located.

Figure 10:
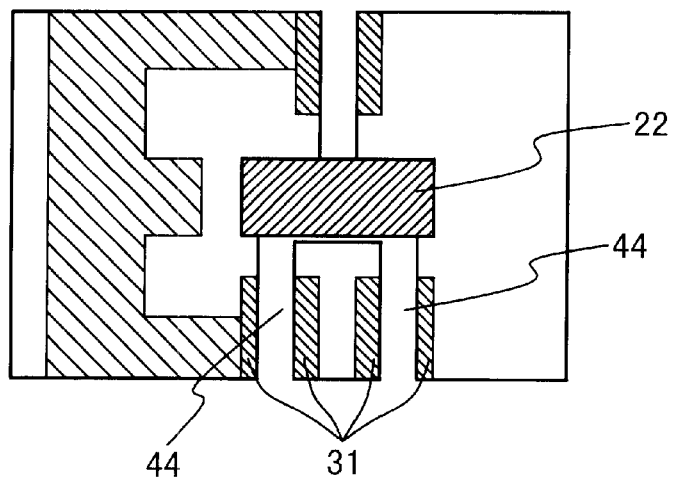
FIG. 10 is a plan view showing a cut result.

Two of first reciprocation plural X-axis direction scan lines 41 are close to and parallel to each other. Two of second reciprocation plural X-axis direction scan lines 42 are close to and parallel to each other. Two of the first reciprocation plural X-axis direction scan lines 41 are connected to first Y-axis direction micro scan lines 45 (separately shown in FIG. 8C, for the purpose of illustration). Two of the second reciprocation plural X-axis direction scan lines 42 are connected to second Y-axis direction micro scan lines 46. Such scanning operation on the scan lines enables the resin burrs 31 deposited on the respective rectangular regions of the one side lead portion 43 and the other side lead portion 44 to be burned away and removed, as shown in FIG. 10.

The package body 22 from which the gate correspondence portion 23 and the resin burr 31 are removed as mentioned above is moved to below the CCD cameral 18. The figure analyzer 19 calculates a distance W (FIG. 8D) between a gate correspondence portion cut line agreeing with the Y-axis direction scan line 27 and an end plane of the package body 22 opposite to the cut line. If the distance W exceeds a set range, the figure analyzer 19 indicates an error, and an error occurrence report to be reported to an operator is performed on the operator.

Such a series of operations is repeatedly performed on each semiconductor package 21. The optical scanner unit 5 for cutting the gate is also used to remove the resin burrs. At the substantially single step, the gate correspondence portion 23 and the resin burrs 31 are removed without any action force bringing about the broken portion of the lead portion. Thus, the yield can be improved.

The apparatus for and the method of processing a gate portion in a semiconductor manufacturing apparatus according to the present invention can remove the gate correspondence portion under the substantially zero action force and further remove the resin portion deposited on the gate and the resin portion deposited on the lead at the high speed in the substantially single step.

What is claimed is:

1. An apparatus processing a gate portion in a semiconductor manufacturing apparatus, comprising:
   a laser beam scanner unit disposed along a carrying line on which a lead frame is carried; and
   a cutter, and
   wherein said laser beam scanner unit has an optical scanner unit second-dimensionally scanning laser beams, and a lens unit collecting said laser beams, and
   wherein said cutter has a punch, said punch mechanically pushing and cutting a gate correspondence portion which is perfectly cut away or almost cut away from a semiconductor package body by said laser beams.

2. The apparatus processing a gate portion in a semiconductor manufacturing apparatus, according to claim 1, wherein said laser beams are YAG laser beams.

3. The apparatus processing a gate portion in a semiconductor manufacturing apparatus, according to claim 1, wherein said optical scanner unit includes:
   a first scanner unit scanning a light collection point of said laser beams in an X-axis direction; and
   a second scanner unit scanning said light collection point of said laser beams in a Y-axis direction substantially orthogonal to said X-axis direction, and
   wherein said laser beam scanned in said Y-axis axis direction cuts away said gate correspondence portion, and
   wherein said laser beam scanned in said Y-axis axis direction removes resin burrs deposited on lead portions exposed from said semiconductor package body.

4. The apparatus processing a gate portion in a semiconductor manufacturing apparatus, according to claim 2, wherein said optical scanner unit includes:
   a first scanner unit scanning a light collection point of said laser beams in an X-axis direction; and
   a second scanner unit scanning said light collection point of said laser beams in a Y-axis direction substantially orthogonal to said X-axis direction, and
   wherein said laser beam scanned in said Y-axis axis direction cuts away said gate correspondence portion, and
   wherein said laser beam scanned in said Y-axis direction removes resin burrs deposited on lead portions exposed from said semiconductor package body.

5. The apparatus processing a gate portion in a semiconductor manufacturing apparatus, according to claim 3, wherein scan lines of said laser beams scanned in said X-axis direction includes two scan lines oriented in said X-axis direction and a micro scan line which connects said two scan lines to be oriented in said Y-axis direction.

6. The apparatus processing a gate portion in a semiconductor manufacturing apparatus, according to claim 4, wherein scan lines of said laser beams scanned in said X-axis direction includes two scan lines oriented in said X-axis direction and a micro scan line which connects said two scan lines to be oriented in said Y-axis direction.

7. The apparatus processing a gate portion in a semiconductor manufacturing apparatus, according to claim 1, further comprising:
   a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

8. The apparatus processing a gate portion in a semiconductor manufacturing apparatus, according to claim 2, further comprising:
   a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

9. The apparatus processing a gate portion in a semiconductor manufacturing apparatus, according to claim 3, further comprising:
   a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

10. The apparatus processing a gate portion in a semiconductor manufacturing apparatus, according to claim 4, further comprising:
    a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

11. The apparatus processing a gate portion in a semiconductor manufacturing apparatus, according to claim 5, further comprising:
    a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

12. The apparatus processing a gate portion in a semiconductor manufacturing apparatus, according to claim 6, further comprising:
    a picture inspector calculating a distance between a boundary line between said gate correspondence portion and said semiconductor package body, which is equivalent to a cut line by the cutting operation of said cutter, and an end plane of said semiconductor package located on a side opposite to said cut line, based on a picture to be photographed to judge whether or not said distance is within a set range.

13. The apparatus processing a gate portion in a semiconductor manufacturing apparatus, according to claim 7, wherein said picture inspector includes a CCD camera having a pixel address on a photographic plane.

14. The apparatus processing a gate portion in a semiconductor manufacturing apparatus, according to claim 8, wherein said picture inspector includes a CCD camera having a pixel address on a photographic plane.

15. The apparatus processing a gate portion in a semiconductor manufacturing apparatus, according to claim 9, wherein said picture inspector includes a CCD camera having a pixel address on a photographic plane.

16. The apparatus processing a gate portion in a semiconductor manufacturing apparatus, according to claim 10, wherein said picture inspector includes a CCD camera having a pixel address on a photographic plane.

17. The apparatus processing a gate portion in a semiconductor manufacturing apparatus, according to claim 11, wherein said picture inspector includes a CCD camera having a pixel address on a photographic plane.

18. The apparatus processing a gate portion in a semiconductor manufacturing apparatus, according to claim 12, wherein said picture inspector includes a CCD camera having a pixel address on a photographic plane.

* * * * *